United States Patent
Idesawa et al.

(10) Patent No.: US 11,100,072 B2
(45) Date of Patent: Aug. 24, 2021

(54) DATA AMOUNT COMPRESSING METHOD, APPARATUS, PROGRAM, AND IC CHIP

(71) Applicant: AISing LTD., Tokyo (JP)

(72) Inventors: Junichi Idesawa, Tokyo (JP); Shimon Sugawara, Tokyo (JP)

(73) Assignee: AISing LTD., Tokyo (JP)

( * ) Notice: Subject to any disclaimer, the term of this patent is extended or adjusted under 35 U.S.C. 154(b) by 245 days.

(21) Appl. No.: 16/232,334

(22) Filed: Dec. 26, 2018

(65) Prior Publication Data

US 2019/0138933 A1 May 9, 2019

Related U.S. Application Data

(63) Continuation of application No. PCT/JP2018/027773, filed on Jul. 24, 2018.

(30) Foreign Application Priority Data

Jul. 31, 2017 (JP) .............................. JP2017-148316

(51) Int. Cl.
*G06F 16/00* (2019.01)
*G06F 16/22* (2019.01)
(Continued)

(52) U.S. Cl.
CPC ........ *G06F 16/2246* (2019.01); *G06F 16/215* (2019.01); *G06F 16/24556* (2019.01);
(Continued)

(58) Field of Classification Search
CPC ............. G06F 16/2246; G06F 16/2272; G06F 16/24556; G06F 16/283; G06N 20/00;
(Continued)

(56) References Cited

U.S. PATENT DOCUMENTS 10,394,779 B2 * 8/2019 Spisic ................. G06F 16/2246
10,592,386 B2 * 3/2020 Walters ............... G06F 16/2264
(Continued)

FOREIGN PATENT DOCUMENTS

JP 2016-173686 A 9/2016
JP 2017-126890 A 7/2017

OTHER PUBLICATIONS

International Search Report issued by the Japan Patent Office for corresponding International Patent Application No. PCT/JP2018/027773, dated Oct. 2, 2018.
(Continued)

*Primary Examiner* — Vincent F Boccio
(74) *Attorney, Agent, or Firm* — Myers Wolin, LLC

(57) ABSTRACT

A data amount compressing method for compressing a data amount corresponding to a learned model obtained by letting the learning model learn a predetermined data group, the learning model having a tree structure in which multiple nodes associated with respective hierarchically divided state spaces are hierarchically arranged, wherein each node in the learned model is associated with an error amount that is generated in the process of the learning and corresponds to prediction accuracy, and the data amount compressing method includes: a reading step of reading the error amount associated with each node; and a node deleting step of deleting a part of the nodes of the learned model according to the error amount read in the reading step, thereby compressing the data amount corresponding to the learned model.

7 Claims, 16 Drawing Sheets

(51) Int. Cl.
  *G06N 20/00*   (2019.01)
  *H03M 7/30*   (2006.01)
  *G06F 16/28*   (2019.01)
  *G06F 16/2455*   (2019.01)
  *G06F 16/215*   (2019.01)

(52) U.S. Cl.
  CPC .......... *G06F 16/283* (2019.01); *G06N 20/00* (2019.01); *H03M 7/3071* (2013.01); *H03M 7/6041* (2013.01); *H03M 7/30* (2013.01)

(58) Field of Classification Search
  CPC ...... G06N 5/003; H03M 7/30; H03M 7/3071; H03M 7/6041
  USPC ......................................................... 707/693
  See application file for complete search history.

(56) References Cited

U.S. PATENT DOCUMENTS

2005/0131946 A1* 6/2005 Korn ................... H04L 63/1458
2009/0292726 A1* 11/2009 Cormode .......... G06F 16/24556

OTHER PUBLICATIONS

Kim et al., "Error-based prediction algorithm for a dynamical system learning tree", IPSJ SIG Technical Report, vol. 2017-MPS-112 No. 25, pp. 1-5, Feb. 28, 2017.

AISing, "From Japan,' 'World's first' machine control AI DeepBinaryTree: DBT", pp. 1-28, Apr. 27, 2018, with partial English translation.

Extended European search report with the supplementary European search report and the European Search Opinion issued by the European Patent Office for corresponding European Patent Application No. 18808202.8-1203, dated Mar. 5, 2021.

Elomaa et al., "An Analysis of Reduced Error Pruning", Journal of Artificial Intelligence Research, vol. 15, pp. 163-187, AI Access Foundation and Morgan Kauffman Publishers, Sep. 2001.

Hussein Almuallim, "An efficient algorithm for optimal pruning of decision trees", Elsevier Science B. V., Artificial Intelligence, vol. 83, pp. 347-362, 1996.

* cited by examiner

Fig. 9

| | NUMBER OF NODES BEFORE COMPRESSION | MEMORY CAPACITY BEFORE COMPRESSION [MB] | NUMBER OF NODES AFTER COMPRESSION | MEMORY CAPACITY AFTER MEMORY COMPRESSION [MB] |
|---|---|---|---|---|
| WITHOUT NOISE | 36399 | 3.09383 | 36382 | 3.09283 |
| WITH 5% NOISE | 36399 | 3.09383 | 17542 | 1.49099 |
| WITH 10% NOISE | 36399 | 3.09383 | 17137 | 1.45656 |

Fig. 12

| No. | NODE DEPTH | ERROR $E^{Diff}$ |
|---|---|---|
| 1 | 4 | 0.289598 ⋯ |
| 2 | 3 | 0.227583 ⋯ |
| 3 | 4 | 0.211482 ⋯ |
| 4 | 3 | 0.211482 ⋯ |
| 5 | 2 | 0.205597 ⋯ |
| ⋮ | ⋮ | ⋮ |

Fig. 14

| | NUMBER OF NODES BEFORE COMPRESSION | MEMORY CAPACITY BEFORE COMPRESSION [MB] | NUMBER OF NODES AFTER COMPRESSION (AFTER FIRST NODE DELETING PROCESSING) | MEMORY CAPACITY AFTER COMPRESSION (AFTER FIRST NODE DELETING PROCESSING) [MB] | NUMBER OF NODES AFTER COMPRESSION (AFTER SECOND NODE DELETING PROCESSING) | MEMORY CAPACITY AFTER MEMORY COMPRESSION (AFTER SECOND NODE DELETING PROCESSING) [MB] |
|---|---|---|---|---|---|---|
| WITHOUT NOISE | 36399 | 3.09383 | 36382 | 3.09283 | 11764 | 0.999855 |
| WITH 5% NOISE | 36399 | 3.09383 | 17542 | 1.49099 | 11764 | 0.999855 |
| WITH 10% NOISE | 36399 | 3.09383 | 16777 | 1.42596 | 11764 | 0.999855 |

US 11,100,072 B2

DATA AMOUNT COMPRESSING METHOD, APPARATUS, PROGRAM, AND IC CHIP

CROSS REFERENCE TO RELATED APPLICATIONS

This application is a continuation application of International Patent Application No. PCT/JP2018/027773, filed Jul. 24, 2018 and claims priority to Japanese Patent Application No. 2017-148316, filed on Jul. 31, 2017, the entire contents of each are herein incorporated by reference.

TECHNICAL FIELD

The present invention relates to a data amount compressing method, a data amount compressing apparatus, a data amount compressing program, and an IC chip, which has a data amount compressing function, that can compress or reduce the data amount of a learned model generated by predetermined learning processing, particularly to a data amount compressing method, a data amount compressing apparatus, a data amount compressing program, and an IC chip, which has a data amount compressing function, that compress or delete the data amount corresponding to a learned model having a tree structure.

BACKGROUND ART

In recent years, the field of machine learning has attracted high attention due to drastic improvement of arithmetic functions of computers and the like. Under such circumstances, the inventors of the present application have proposed a novel framework of machine learning having a tree structure (Patent Literature 1), and this framework has attracted high attention for the reason that it easily permits additional learning, high calculation speed, effect of reducing memory capacity used, and the like.

FIG. 16 is an explanatory diagram showing the above-described novel framework of machine learning. FIG. 16(a) shows the structure of a learning tree in the learning method, and FIG. 16(b) shows the image of the state space corresponding to the structure. As is clear from the drawing, in the learning tree structure, nodes corresponding to the respective hierarchically divided state spaces are arranged from the top node (starting node or root node) to the bottom node (terminal node or leaf node) in a tree shape or lattice shape. It should be noted that the drawing shows an example of the case of the learning tree with N layers, d dimensions, and n divisions where N is 2, d is 2, and n is 2, and the numbers 1 to 4 representing the four terminal nodes in the learning tree shown in FIG. 16(a) correspond to the four state spaces shown in FIG. 16(b), respectively.

During learning processing using the above-mentioned learning tree, the input data are sequentially associated with the respective divided state spaces and are accumulated in the respective state spaces. At this time, when data are newly input to state spaces where no data existed, new nodes are sequentially generated. The predicted output is calculated by taking the arithmetic mean of the values or vectors of the data included in the respective state spaces after learning. In other words, usually in learning using the above-described learning tree, as the learning progresses, the number of nodes constituting the learning tree increases.

CITATION LIST

Patent Literature

Patent Literature 1: Japanese Patent Laid-Open No. 2016-173686

SUMMARY OF INVENTION

Technical Problem

By the way, with the above-described framework of learning, the number of nodes constituting the learning tree increases with the progress of the learning or an improvement in prediction accuracy; thus, when a large amount of data is learned, the amount of data to be stored may be enormous. In that case, for example, it is sometimes difficult to mount a learned algorithm on an IC chip or the like having a certain restriction on storage capacity.

It is also conceivable to delete a part of the learned model in order to reduce data amount. However, if the data amount of such a learned model having a tree structure is inadvertently reduced, the prediction accuracy may be lowered.

An object of the present invention, which has been made under the above-mentioned technical background, is to compress the data amount of a learned model while minimizing a decrease in prediction accuracy.

Other objects and effects of the present invention should be readily understood by those skilled in the art by referring to the following statement of Description.

Solution to Problem

The above-mentioned technical problem can be solved by a data amount compressing method, apparatus, program, and IC chip having the following configuration.

In particular, a data amount compressing method according to the present disclosure is a data amount compressing method for compressing a data amount corresponding to a learned model obtained by letting the learning model learn a predetermined data group, the learning model having a tree structure in which multiple nodes associated with respective hierarchically divided state spaces are hierarchically arranged, wherein each node in the learned model is associated with an error amount that is generated in the process of the learning and corresponds to prediction accuracy, and the data amount compressing method comprises: a reading step of reading the error amount associated with each node; and a node deleting step of deleting a part of the nodes of the learned model according to the error amount read in the reading step, thereby compressing the data amount corresponding to the learned model.

With such a configuration, nodes of the learned model are deleted according to the error amount corresponding to the prediction accuracy; thus, the data amount of the learned model can be compressed while minimizing a decrease in prediction accuracy.

The node deleting step may further comprise a first data amount compressing step, and the first data amount compressing step may comprise: a target node deleting step of setting one of the nodes as a target node and deleting the target node when an error amount of the target node is greater than an error amount of a node one level higher than the target node by a predetermined value or more and any node that has an error amount less than the error amount of the target candidate node for deletion does not exist in the levels lower than the target node; and a repeating processing step of repeating the target node deleting step while sequentially changing the target node.

With such a configuration, in the learned model, a node with an error larger than that of the node in a higher level is deleted, so that the data amount can be compressed without affecting the prediction accuracy. Further, with the above-described configuration, even if the error amount is larger than that of the node in the higher level, deletion is not performed when a node with high prediction accuracy exists in a lower level; thus, deletion of the node with high prediction accuracy can be prevented and a decrease in prediction accuracy due to compression can also be prevented.

The node deleting step may further comprise a second data amount compressing step, and the second data amount compressing step may comprise: an inter-node error amount calculating step of calculating a difference between an error amount associated with each terminal node of the tree structure of the learned model and an error amount of a node one level higher than the corresponding terminal node thereby calculating an inter-node error amount; a largest-error-amount node deleting step of deleting the node having the largest error amount according to the inter-node error amounts calculated in the inter-node error amount calculating step; and a comparison step of acquiring a data amount corresponding to the learned model for a comparison between the data amount corresponding to the learned model and a target data amount, and the largest-error-amount node deleting step and the comparison step may be repeated until the data amount corresponding to the learned model falls at or below the target data amount, and the repeating processing may end when the data amount corresponding to the learned model falls at or below the target data amount.

With such a configuration, nodes are deleted in descending order of their inter-node error amounts until the target data amount or less is achieved; thus, the data amount can be compressed while minimizing a decrease in prediction accuracy.

The second data amount compressing step may further comprise a step of deleting nodes in descending order of their inter-node error amounts, and when nodes of an equal or substantially equal inter-node error amount exist, deleting the node closer to a terminal end of the tree structure earlier.

With such a configuration, while deleting nodes closer to the terminal end in descending order of their error amounts in principle, if there are nodes of an equal error amount, nodes closer to the terminal end are deleted so that node deletion is performed considering the overall balance of the tree structure; thus, the data amount can be compressed while minimizing a decrease in prediction accuracy.

In the data amount compressing method, the data amount compressing method may comprise a target data amount acquisition step of acquiring a target data amount designated by a user.

With such a configuration, the target data amount is given by the user, so that compression can be continued until an arbitrary data amount designated by the user is achieved. Thus, the learned model can be mounted, for example, on an IC chip or the like.

The present disclosure further includes a data amount compressing apparatus. In particular, a data amount compressing apparatus according to the present disclosure is a data amount compressing apparatus for compressing a data amount corresponding to a learned model obtained by letting the learning model learn a predetermined data group, the learning model having a tree structure in which multiple nodes associated with respective hierarchically divided state spaces are hierarchically arranged, wherein each node in the learned model is associated with an error amount that is generated in the process of the learning and corresponds to prediction accuracy, and the data amount compressing apparatus comprises: a reading unit for reading structure information about a structure of the learned model, and the error amount associated with each node; and a node deleting unit for deleting a part of the nodes of the learned model according to the structure information and the error amount read by the reading unit, thereby compressing the data amount corresponding to the learned model. It should be noted that this data amount compressing apparatus includes, for example, a server apparatus.

The present disclosure further includes a computer program that makes a computer function as a data amount compressing apparatus. In particular, a program according to the present disclosure is a data amount compressing program for making a computer function as a data amount compressing apparatus for compressing a data amount corresponding to a learned model obtained by letting the learning model learn a predetermined data group, the learning model having a tree structure in which multiple nodes associated with respective hierarchically divided state spaces are hierarchically arranged, wherein each node in the learned model is associated with an error amount that is generated in the process of the learning and corresponds to prediction accuracy, and the data amount compressing program comprises: a reading step of reading structure information about a structure of the learned model, and the error amount associated with each node; and a node deleting step of deleting a part of the nodes of the learned model according to the structure information and the error amount read in the reading step, thereby compressing the data amount corresponding to the learned model.

The present disclosure further includes an IC chip having a data amount compressing function. In particular, the IC chip is an IC chip for compressing a data amount corresponding to a learned model obtained by letting the learning model learn a predetermined data group, the learning model having a tree structure in which multiple nodes associated with respective hierarchically divided state spaces are hierarchically arranged, wherein each node in the learned model is associated with an error amount that is generated in the process of the learning and corresponds to prediction accuracy, and the IC chip comprises: a reading unit for reading structure information about a structure of the learned model, and the error amount associated with each node; and a node deleting unit for deleting a part of the nodes of the learned model according to the structure information and the error amount read by the reading unit, thereby compressing the data amount corresponding to the learned model.

Advantageous Effects of Invention

A data amount compressing method, apparatus, program, and IC chip according to the present invention can compress the data amount of a learned model while minimizing a decrease in prediction accuracy.

BRIEF DESCRIPTION OF DRAWINGS

FIG. 9 shows the experimental results of compression processing according to error amount designation.

FIG. 12 is a conceptual diagram related to sort processing.

FIG. 14 is the experimental results of compression processing according to data amount designation.

DESCRIPTION OF EMBODIMENTS

One embodiment of data amount compressing method, apparatus, program, and IC chip according to the present invention will now be described in detail with reference to the accompanying drawings.

1. First Embodiment (Compression Processing According to Error Amount Designation)

Referring to FIGS. 1 to 9, a data amount compressing apparatus according to this embodiment will be described.
<1.1 Apparatus Configuration>

Figure 1:
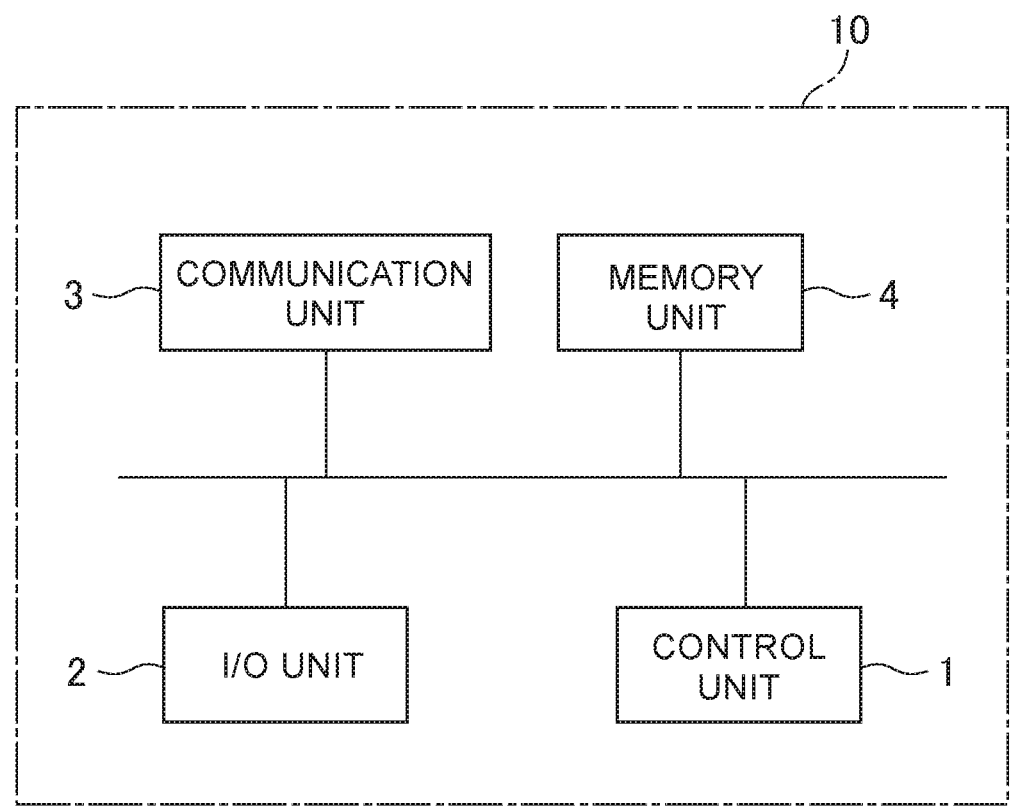
FIG. 1 is an explanatory diagram showing a hardware configuration of a data amount compressing apparatus.

FIG. 1 is an explanatory diagram showing the hardware configuration of a data amount compressing apparatus 10 according to this embodiment. As is clear from the drawing, the data amount compressing apparatus 10 includes a control unit 1, an I/O unit 2 for controlling input/output to/from an external device, a communication unit 3 for controlling wireless or wired communication, and a memory unit 4, which are connected to each other via a system bus. The control unit 1 consists of a CPU and executes various programs including a program for compressing the data amount of a learned model having a tree structure which will be described later. Note that a microprocessor, a microcontroller, a graphics processing unit (GPU), or the like may be used instead of this CPU or the like. The memory unit 4 serves as various storage devices including a ROM, a RAM, a flash memory, and a hard disk, and temporarily or non-temporarily stores various data related to a learned model having a tree structure, data corresponding to teaching data, and a program having a function of compressing the data amount of a learned model, for example.

Note that the configuration of the information processing apparatus 10 is not limited to the configuration shown in the drawing, but can be freely changed within the scope of technical common sense at the time of filing. Accordingly, for example, the memory unit 4 may be separately provided as an external storage or the like. Similarly, the control unit 1 may perform distribution processing or the like in cooperation with a control unit or the like in another information processing apparatus. Further, processing using a virtualization technique or the like may be performed.
<1.2 Operation of Apparatus>
<1.2.1 Learning Processing>

An example of learning processing for generating a learned model to be subjected to data amount compression through the data amount compressing apparatus 10 will be described with reference to FIGS. 2 to 3.

Figure 2:
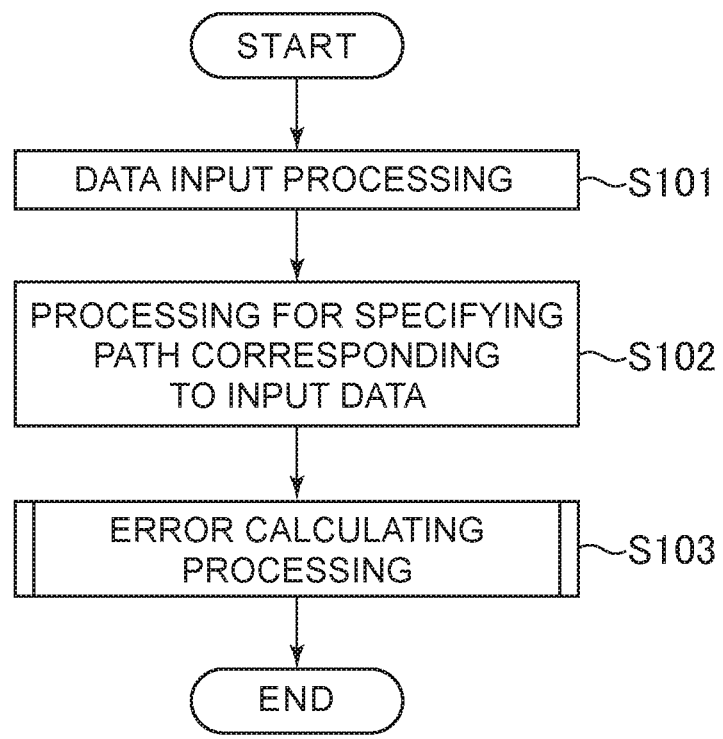
FIG. 2 is a general flow chart related to the learning processing.

FIG. 2 is a general flow chart related to the learning processing. Upon the start of the processing, data to be learned is first input to a learning model having a tree structure (S101). Next, for the input data, the state space to which the data should belong and the node corresponding to that state space are specified, so that one path between multiple nodes, that is, from the root node to the terminal node is specified (S102). At this time, if a node that has never become active in the past exists on the path, a new node is generated in the position. Afterwards, for each node on the path, processing for calculation of an error corresponding to the predicted error of each node is performed (S103).

Figure 3:
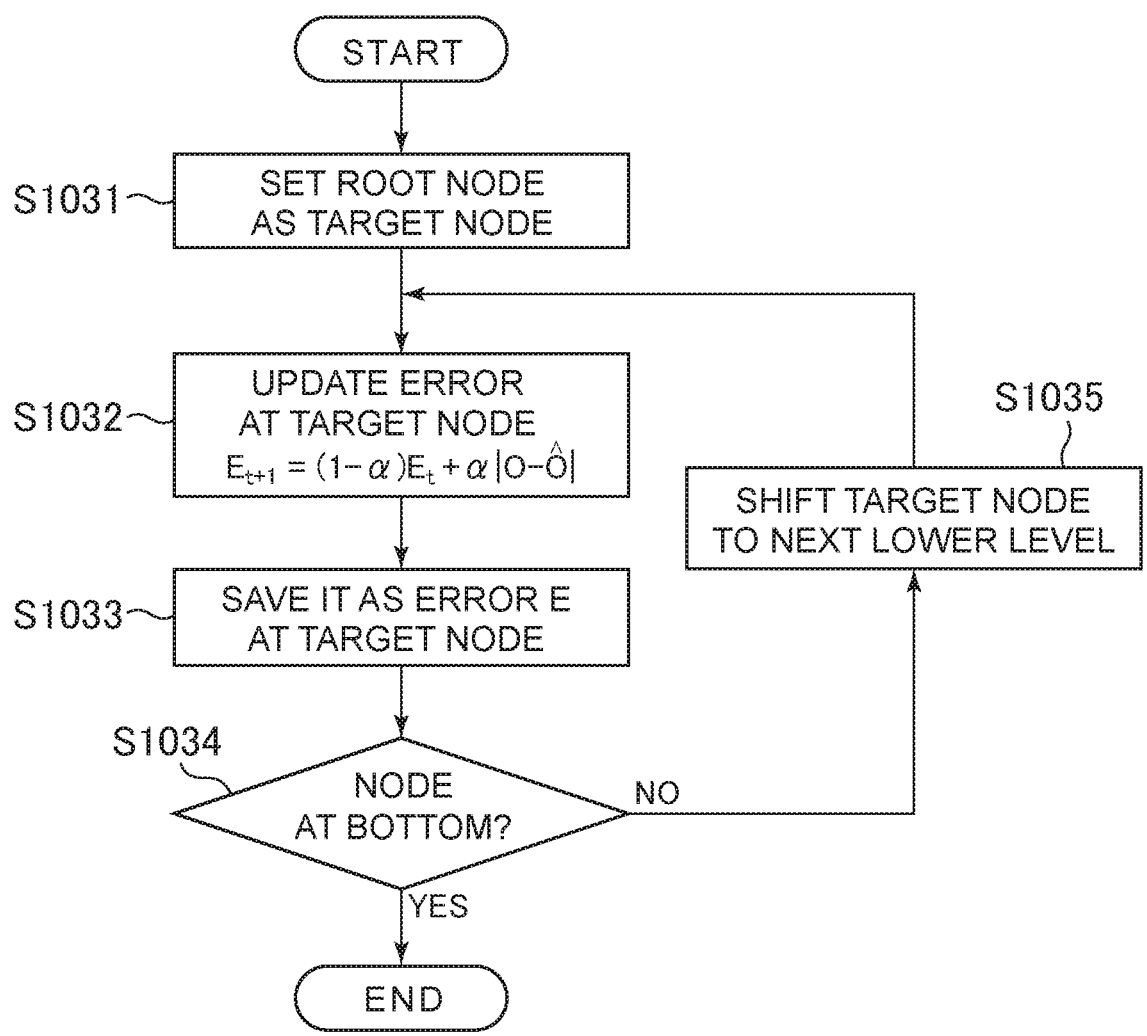
FIG. 3 is a flow chart related to error calculation processing.

FIG. 3 is a flow chart showing the details of error calculation processing (S103). Upon the start of the processing, the root node is first set as a target node (S1031). Next, for the target node, error updating processing is performed according to the following equation (S1032).

$$E_{t+1} = (1-\alpha)E_t + \alpha|\hat{O} - O|$$ [Expression 1]

Here, $E_{t+1}$ represents an updated error, $E_t$ represents a non-updated data, $\alpha$ represents the forgetting factor ($0 < \alpha < 1$). As is clear from the equation, the updated error $E_{t+1}$ is calculated by adding the non-updated data $E_t$ to a product of a forgetting factor $\alpha$ and the absolute value of a difference between the value or vector corresponding to the teaching data and a predicted output O based on the value or vector of each piece of data included in the target node (e.g., the arithmetic mean value of the value or vector of each piece of data included in the target node). In other words, as the difference between the predicted output O based on the value or vector of each piece of data included in the target node and the value or vector corresponding to the teaching data decreases, $E_{t+1}$ decreases, which means that as the error $E_{t+1}$ decreases, higher prediction accuracy is obtained. The updated error $E_{t+1}$ is stored in the memory unit 4 as an error E in association with the target node (S1033).

Afterwards, determination processing for determining whether or not this target node is at the bottom (S1034). If the node is not at the bottom, processing for shifting the target node to the next lower level is performed (S1035). This series of processing including processing for shifting the node to the next lower level on the path of the target node (S1035), error updating processing (S1032), and storage processing (S1033) is repeated until it reaches a node at the bottom (NO in S1034). On the other hand, when the target node reaches the node at the bottom (terminal node) (YES in S1034), the processing ends. In other words, this series of processing generates an error E corresponding to prediction accuracy for each of all nodes on the path.

The method of calculating the error E is not limited to the above-described one. Accordingly, an error obtained, for example, by referring to a node present on the path at a level lower than that of the target node may be used, for example.
<1.2.2 Prediction Processing>

Next, an example of prediction processing using a learned model that has been subjected to the above-described learning processing will be described with reference to FIG. 4.

Figure 4:
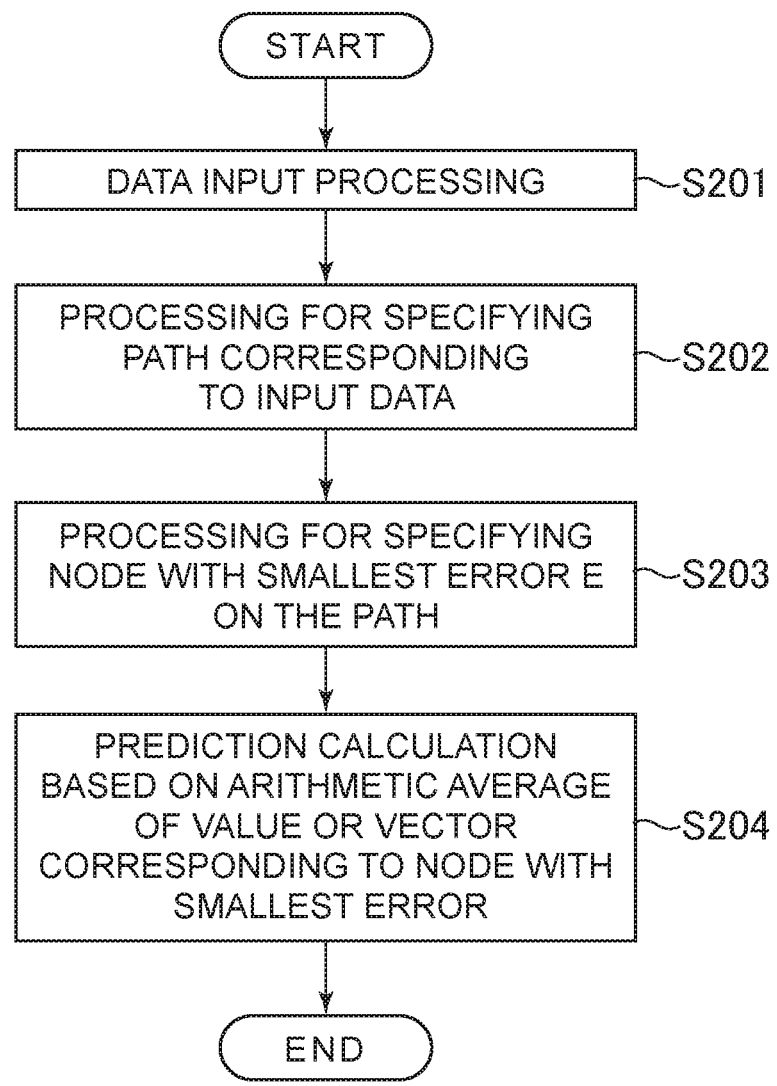
FIG. 4 is a flow chart related to prediction processing.

FIG. 4 is a flow chart related to prediction processing. As is clear from the drawing, upon the start of processing, new input data is first read from the memory unit 4 (S201). Next, according to the input data, the state space (node) to which it should belong is specified, so that one path consisting of a series of nodes is specified (S202). When one path is specified, a node having the smallest error E on the path is specified (S203), and a predicted output is generated based on the arithmetic mean of the value or vector of each piece of data corresponding to the node with the minimum error E (S204). In other words, a prediction output is generated based on the node with the minimum error on the path. Thus, a predicted output can be generated based on the node predicted to have comparatively high prediction accuracy.

The predicted output is generated based on the data corresponding to the node with the minimum error on the path in this embodiment, but this is not the only way of processing. Accordingly, a predicted output may be always generated based on the data corresponding to a terminal node.

<1.2.3 Processing for Compressing Data Amount>

Next, processing for compressing the data amount of a learned model by designating the error amount will be described with reference to FIGS. 5 to 8.

Figure 5:
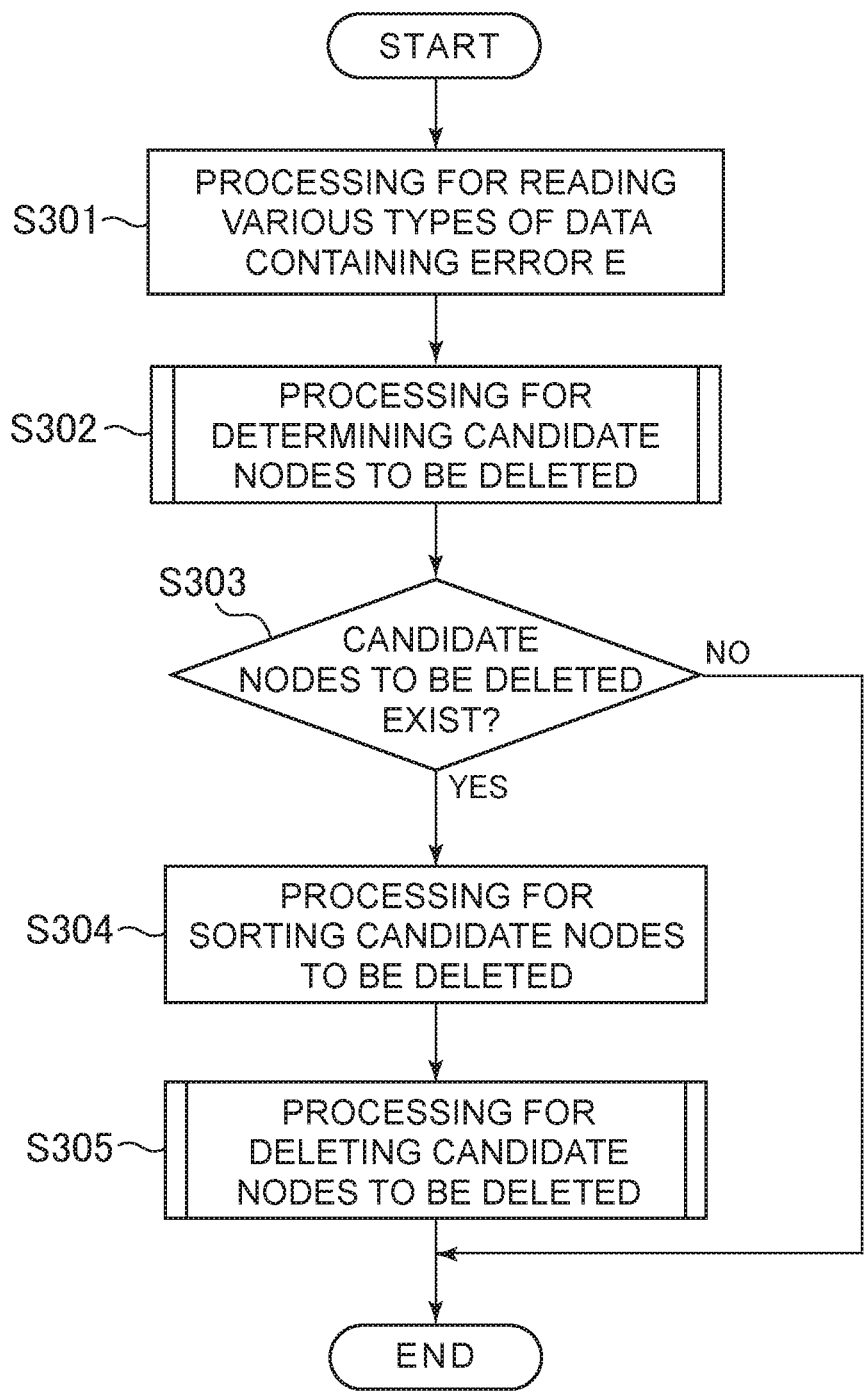
FIG. 5 is a general flow chart related to compression processing according to error amount designation.

FIG. 5 is a general flow chart related to compression processing according to error amount designation. As is clear from the drawing, upon the start of the processing, various kinds of data related to a learned model including the error E are first read from the memory unit 4 (S301). After various kinds of data are read, processing is performed for determination of the candidate node to be deleted (S302).

Figure 6:
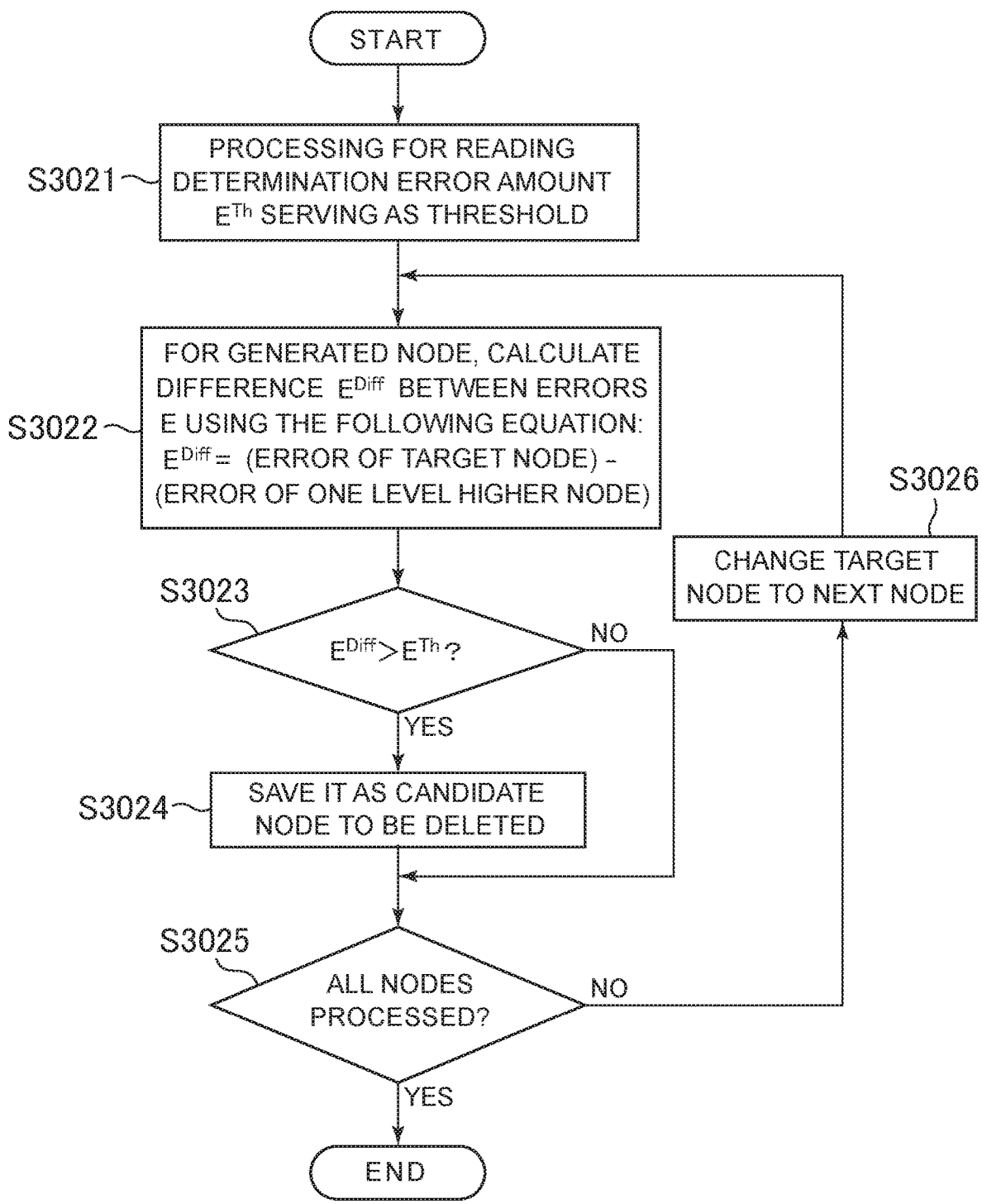
FIG. 6 is a flow chart related to processing for determination of a node to be deleted.

FIG. 6 is a flow chart related to processing for determination of a node to be deleted. As is clear from the drawing, upon the start of the processing, processing is performed for reading a determination error amount $E^{Th}$ serving as a threshold from the memory unit (S3021). In this embodiment, the determination error amount $E^{Th}$ is previously specified by the user. The determination error amount $E^{Th}$ is a value of greater than or equal to 0 in principle, but may be a negative value. Next, the difference $E^{Diff}$ between the error E of the target node and the error E of the node one level higher than the target node is calculated (S3022). If the difference $E^{Diff}$ is greater than the above-described determination error amount $E^{Th}$ (YES in S3023), the target node is stored as a candidate node for deletion (S3024). In contrast, if the difference $E^{Diff}$ is less than or equal to the above-described determination error amount $E^{Th}$ (NO in S3023), the process proceeds to the next step without performing any processing on the target node (without setting it as a candidate node for deletion). Afterwards, determination processing is performed for determining whether or not processing has been performed on all the nodes (S3025). If processing has not been performed on all the nodes (NO in S3025), processing is performed for shifting the target node to a predetermined next node (S3026), and determination processing is performed again for determining whether it is a candidate node to be deleted (S3022 to S3024). In contrast, if it is determined that processing has been performed on all the nodes (YES in S3025), the processing ends.

Referring back to FIG. 5, upon completion of the processing for determination of a candidate node to be deleted (S302), whether or not a candidate node to be deleted exists is determined (S303). Consequently, if there is no candidate node to be deleted (NO in S303), the processing ends. In contrast, if there is a candidate node to be deleted (YES in S303), predetermined sort processing is performed (S304), and deletion processing, which will be described later, is performed for deleting the candidate node to be deleted (S305). After this deletion processing, the processing ends.

Figure 7:
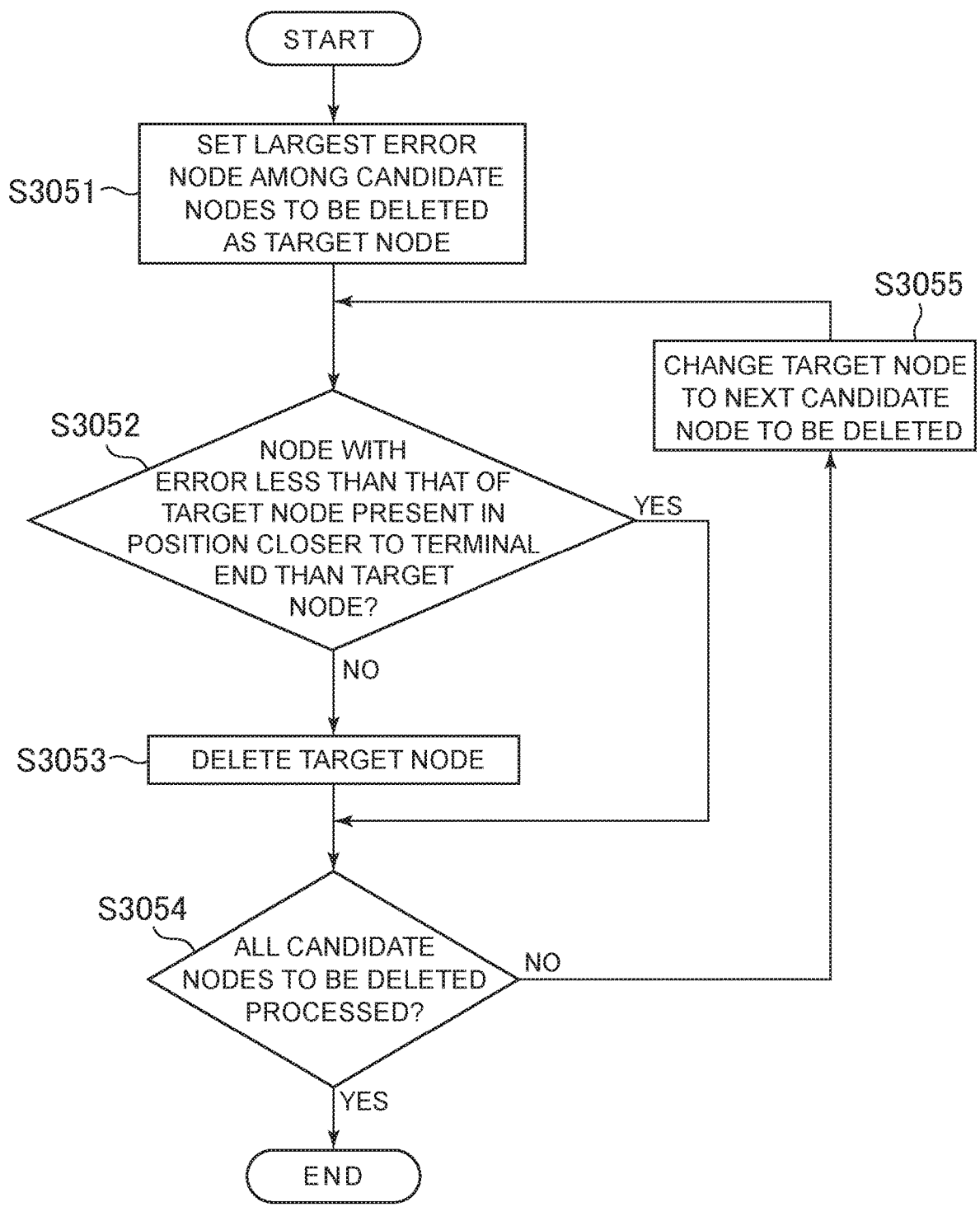
FIG. 7 is a flow chart related to a target to be deleted.

FIG. 7 is a detailed flow chart related to processing (S305) for deleting a candidate node to be deleted. As is clear from the drawing, upon the start of the processing, the node having the largest error among the candidate nodes to be deleted is set as a target node (S3051). After the target node is set, processing is performed for determining whether or not a node with an error E smaller than the error E of the target node exists in a position closer to the terminal end than the target node (S3052). After the determination processing, if there is a node with an error greater than or equal to the error of the target node in a position closer to the terminal end than the target node (NO in S3052), processing is performed for deleting the target node (S3053). In contrast, after the determination processing, if there is a node with an error less than the error of the target node in a position closer to the terminal end than the target node (YES in S305), no processing is performed (no processing for deleting the target node is performed) and the next processing is performed. Afterwards, whether or not processing has been performed on all the candidate nodes to be deleted is determined (S3054). If processing has not been performed on all the candidate nodes to be deleted (NO in S3054), the target node is changed to a predetermined next candidate node to be deleted (S3055), and processing is performed again for determining deletion of the target node (S3052 and S3053). In contrast, if processing has been performed on all the candidate nodes to be deleted (YES in S3054), the processing ends.

With the above-described configuration, in the learned model, a node with an error larger than that of the node in the next higher level is deleted, so that the data amount can be compressed without affecting the prediction accuracy. Further, with the above-described configuration, even if the error is larger than that of the node in the next higher level, deletion is not performed if any node in the next lower level has higher prediction accuracy; thus, deletion of the node with high prediction accuracy can be prevented and a decrease in prediction accuracy due to compression can also be prevented.

Figure 8:
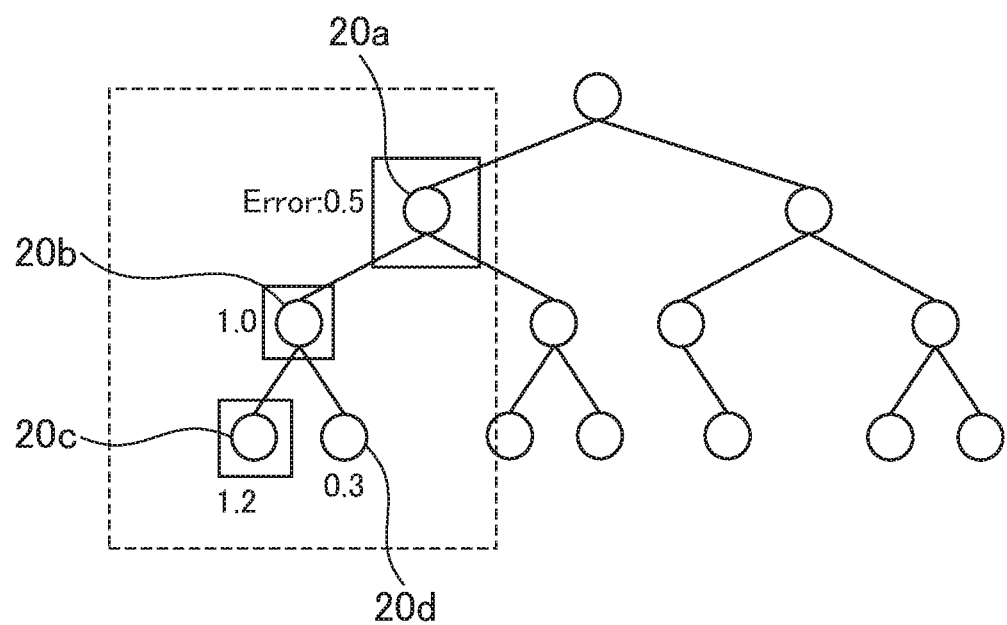
FIG. 8 is a conceptual diagram related to node deleting processing.

A concrete example of node deletion according to this embodiment will now be described with reference to FIG. 8. FIG. 8 is a conceptual diagram related to the above-described node deleting processing. In the dashed line frame in the drawing, there are a first node 20a, a second node 20b that exists one level lower than the first node, a third node 20c that is one of the nodes that exist one level lower than the second node, and a fourth node 20d that is the other of the nodes that exist one level lower than the second node. In this example, the error E of the first node 20a is 0.5, the error E of the second node 20b is 1.0, the error E of the third node 20c is 1.2, and the error E of the fourth node 20d is 0.3. Further, the determination error amount $E^{Th}$ is 0.1.

Suppose that the target node is the second node 20b. At this time, the difference of 0.5 between the error E of 1.0 of the second node 20b, which is the target node, and the error E of 0.5 of the first node 20a one level higher than it (S3022) is larger than the determination error amount $E^{Th}$ of 0.1 (YES in S3023). Accordingly, the second node is a candidate node to be deleted (S3024). Subsequently, since a candidate node to be deleted exists (YES in S303), determination of whether there is a node having an error less than the error E of 0.5 of the second node 20b in the next lower level (S3052) determines that, because the error E of the fourth node 20d is 0.3, there is a node having an error less than the error E of the second node 20b of 0.5 (YES in S3052). Consequently, in this case, the second node 20*b* is left without being deleted. Note that, when the same experiment is carried out, concerning the node to be deleted in the dashed line frame in the drawing, the only node that has an error larger than that of the higher-level node by 0.1 or more and does not have any lower-level node with a smaller error is the third node 20*c*. This is a specific example of the node deleting processing according to this embodiment.

<1.2.4 Experimental Results>

Next, an example of actual compression of the data amount of a learned model having a tree structure using the data amount compressing apparatus 10 according to this embodiment will be described with reference to FIG. 9.

FIG. 9 is a table summarizing the experimental results of compression processing according to error amount designation. The drawing shows the experimental results, specifically the number of nodes and memory capacity [MB] before compression and the number of nodes and memory capacity [MB] after compression, obtained when a learned model that has been made learn predetermined data without noise (in this embodiment, a sine curve) is compressed, when a learned model that has been made learn predetermined data with 5% noise is compressed, and when a learned model that has been made learn predetermined data with 10% noise is compressed.

When a learned model that has been made learn predetermined data without noise is compressed, the number of nodes that was 36399 before compression was reduced to 36382 after compression, and the memory capacity was reduced from 3.09383 [MB] to 3.09283 [MB]. These experimental results show that in the case of the learned model that has been made learn without noise given, the prediction error at the terminal node is small and significant effect of data amount reduction cannot therefore be obtained.

When a learned model that has been made learn predetermined data with 5% noise is compressed, the number of nodes that was 36399 before compression was reduced to 17542 after compression, and the memory capacity was reduced from 3.09383 [MB] to 1.49099 [MB]. These experimental results show that 5% noise given results in a decrease in the prediction accuracy at the node at the terminal end, thereby providing a higher effect of reducing data amount than when a learned model that has been made learn data without noise was compressed.

When a learned model that has been made learn predetermined data with 10% noise is compressed, the number of nodes that was 36399 before compression was reduced to 17137 after compression, and the memory capacity was reduced from 3.09383 [MB] to 1.45656 [MB]. These experimental results show that 10% noise given results in a decrease in the prediction accuracy at the node at the terminal end, thereby providing a higher effect of reducing data amount than when a learned model that has been made learn data with 5% noise was compressed.

These experimental results demonstrate that the larger the prediction error of a node existing in the learned model, the greater the effect of reducing the data amount.

2. Second Embodiment (Compression Processing According to Target Data Amount Designation)

In the first embodiment, a node is set as a candidate node to be deleted when the difference between its error and that of the higher-level node is greater than or equal to the predetermined amount, and the deletion processing is performed on the candidate node to be deleted under predetermined conditions. For this reason, how much data amount will be deleted cannot be predicted in advance. In this embodiment, a description will be given of a data amount compressing apparatus with which the user designates a target data amount and performs processing for compressing the data amount until it reaches the target data amount.

<2.1 Apparatus Configuration>

Since the data amount compressing apparatus according to this embodiment has substantially the same hardware configuration as the data amount compressing apparatus 10 according to the first embodiment, the description thereof will be omitted here.

<2.2 Processing for Compressing Data Amount>

Figure 10:
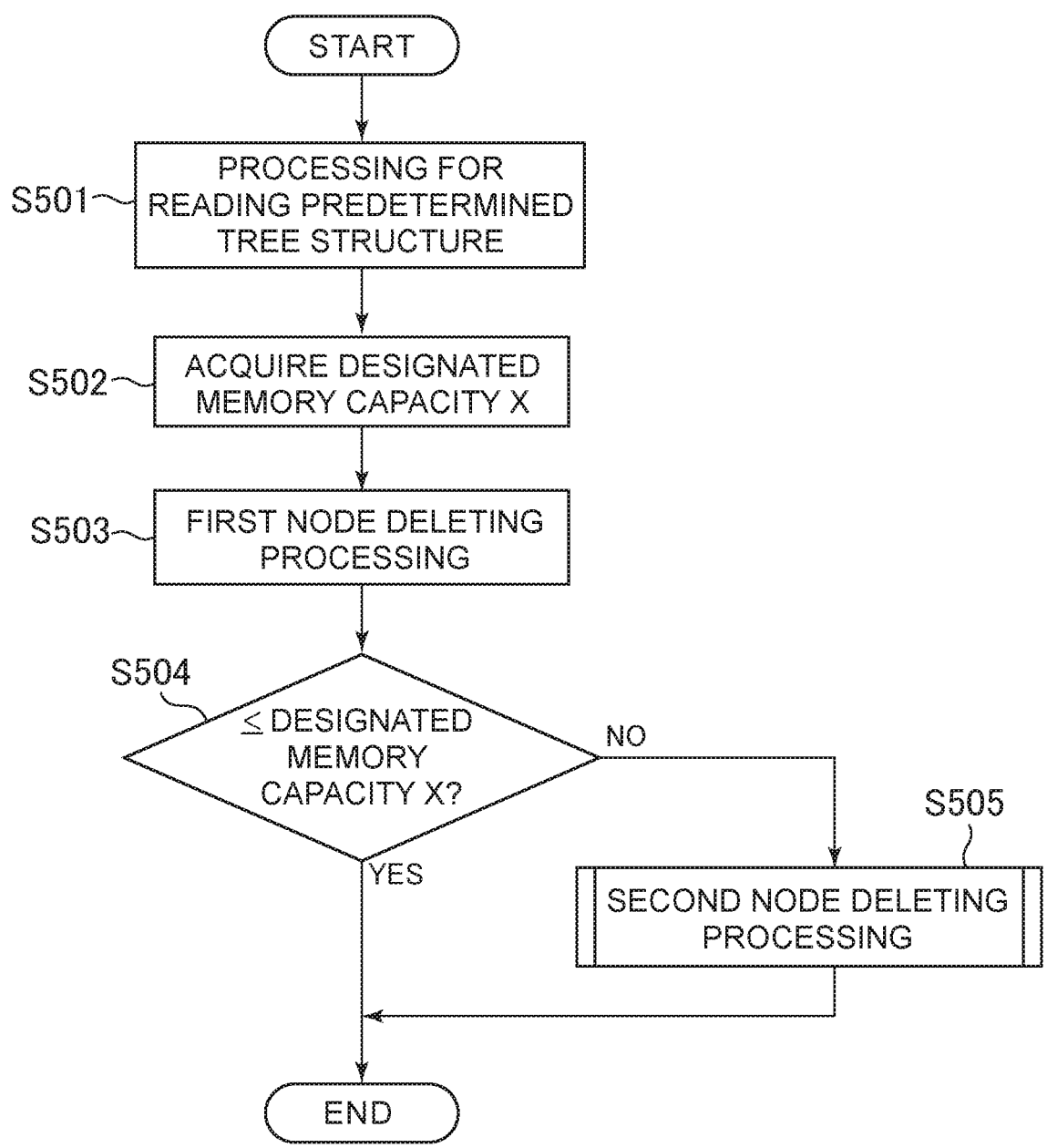
FIG. 10 is a general flow chart related to compression processing according to data amount designation.

FIG. 10 is a general flow chart related to compression processing according to target data amount designation. As is clear from the drawing, upon the start of the processing, processing is performed for reading a learned model having a predetermined tree structure from the memory unit 4 (S501). Afterwards, processing is performed for acquiring the target storage capacity (data amount) (X) designated by the user (S502). It should be noted that this acquisition processing may be performed to read the prestored storage capacity (X) or to require the user for inputting via a GUI or the like.

After processing is performed for acquiring the storage capacity (X) (S502), the first node deleting processing is performed (S503). This first node deleting processing is data amount compressing processing according to the first embodiment. After this first node deleting processing, it is determined whether or not the data amount (storage capacity) is less than or equal to the designated storage capacity (X) (S504). Here, if the data amount after the first node deleting processing is less than or equal to the designated storage capacity (X), the processing ends. In contrast, if the data amount after the first node deleting processing is greater than the designated storage capacity (X) (NO in S504), the second node deleting processing, which will be described later, is performed (S505) and the processing then ends.

Figure 11:
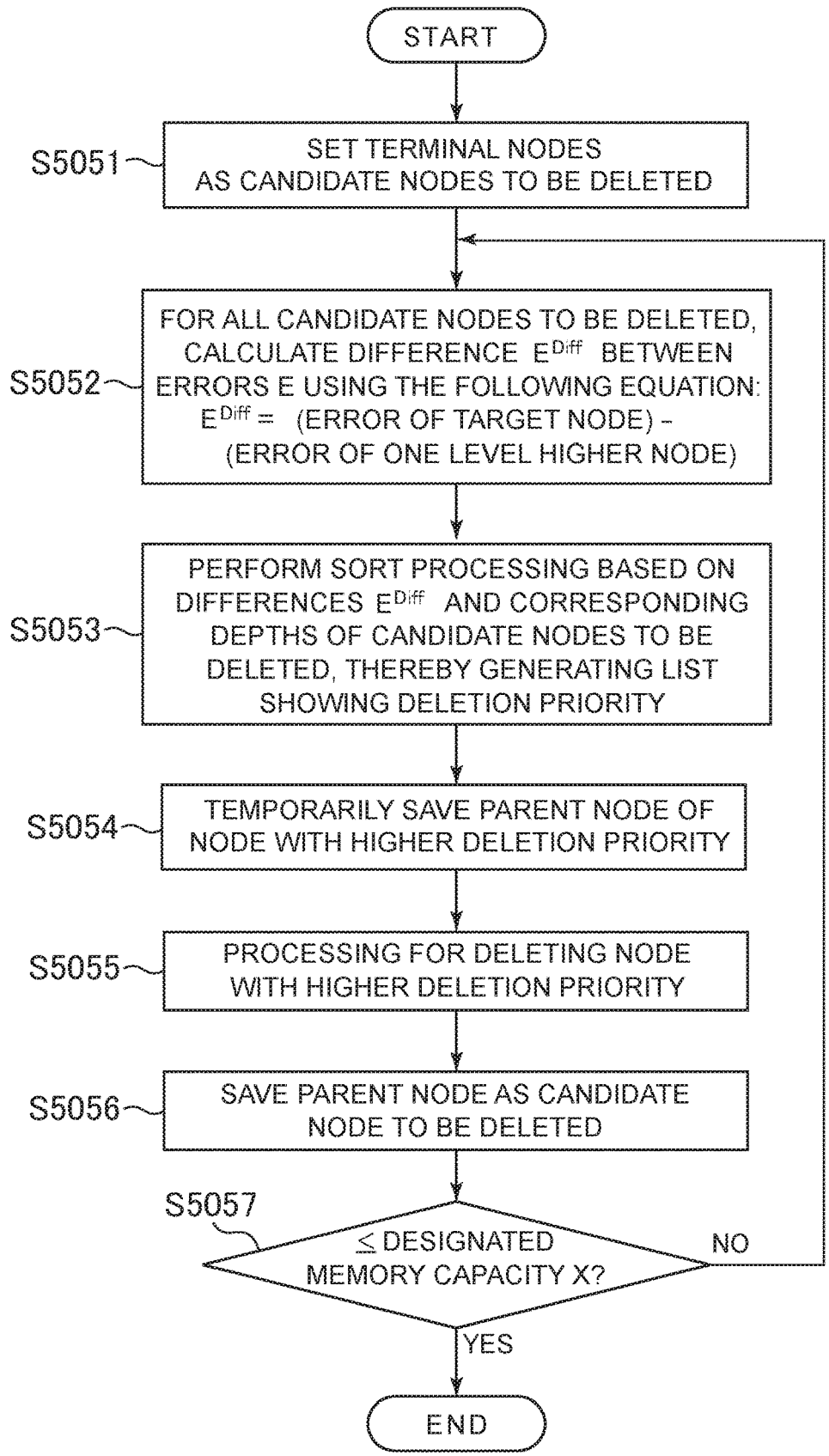
FIG. 11 is a flow chart related to second node deleting processing.

FIG. 11 is a detailed flow chart related to the second node deleting processing (S505). Upon the start of the processing, all the terminal nodes are set as candidate nodes to be deleted (S5051). Next, for all the candidate nodes to be deleted, the difference $E^{Diff}$ between the error E of the target node and the error E of the node one level higher than the target node is calculated (S5052). Afterwards, sort processing is performed based on the difference $E^{Diff}$ associated with each candidate node to be deleted and the depth of the candidate node for deletion in the tree structure (the depth increases toward the terminal end), and a list with deletion priority is generated (S5053).

FIG. 12 is a conceptual diagram of the deletion priority list generated by the sort processing. In the drawing, the left column shows the deletion priority, the central column shows the node depth (the number increases toward the terminal end), and the right column shows the error difference $E^{Diff}$. In the drawing, the higher the level, the larger the error difference $E^{Diff}$. When there are nodes of an equal difference, the node with a larger depth is sorted higher (see the rows No. 3 and No. 4 in the drawing).

Referring back to FIG. 11, after the above-described sort processing (S5053), a node with a higher deletion priority is specified based on the deletion priority, and data of the parent node of (the node one level higher than) that node is temporarily stored in the memory unit 4 (S5054). Afterwards, the node with the higher deletion priority is deleted (S5055), and the temporarily stored parent node is added as a candidate node to be deleted and stored (S5056).

Afterwards, the data amount related to a learned model is read and whether or not the data amount is less than or equal to the designated storage capacity (X) (S5057). Consequently, if the data amount related to the learned model is still greater than the designated storage capacity (X) (NO in S5057), a series of deletion processing (S5052 to S5056) is performed again. In contrast, if the data amount related to the learned model is less than or equal to the designated storage capacity (X) (YES in S5057), the processing ends.

With such a configuration, while deleting nodes closer to the terminal end in descending order of their error amounts in principle, if there are nodes of an equal error amount, nodes closer to the terminal end are deleted so that node deletion is performed considering the overall balance of the tree structure; thus, the data amount can be compressed while minimizing a decrease in prediction accuracy.

Figure 13:
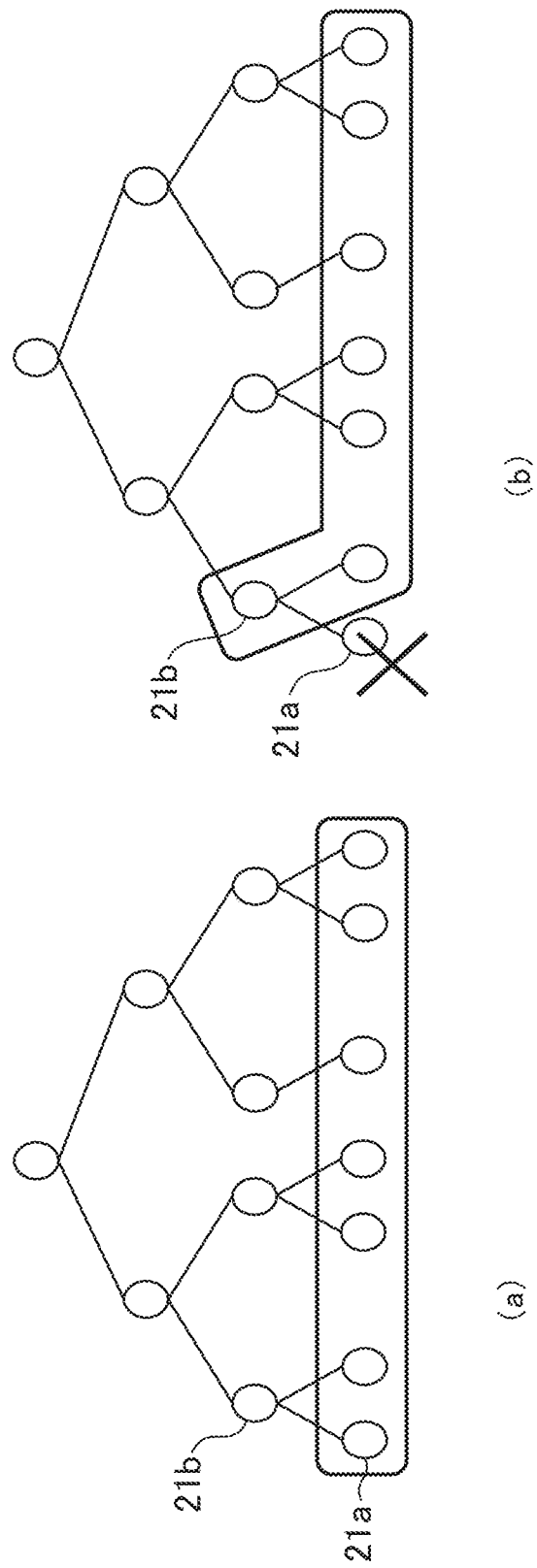
FIG. 13 is a conceptual diagram of compression processing according to data amount designation.

FIG. 13 is a conceptual diagram of compression processing according to data amount designation. FIG. 13(a) shows the state before the second node deleting processing (S505), and FIG. 13(b) shows the state after the second node deleting processing (S505). Referring to both of the drawings, when the node 21a located at the left end of the terminal end is deleted because the difference of the error is in a higher order, the parent node 21b becomes the next candidate node to be deleted.

With such a configuration, nodes are deleted in descending order of their inter-node errors until the target data amount or less is achieved; thus, the data amount can be compressed while minimizing a decrease in prediction accuracy. In addition, since the target data amount is given by the user, compression can be continued until an arbitrary data amount designated by the user is achieved, so that the learned model can be mounted, for example, on a desired IC chip or the like.

<2.3 Experimental Results>

FIG. 14 is a table summarizing the experimental results of compression processing according to data amount designation. The drawing shows the experimental results, specifically the number of nodes and memory capacity [MB] before compression, the number of nodes and memory capacity [MB] after the first node deleting processing (S503), and the number of nodes and memory capacity [MB] after the second node deleting processing (S505), obtained when a learned model that has been made learn predetermined data without noise (in this embodiment, a sine curve) is compressed, when a learned model that has been made learn predetermined data with 5% noise is compressed, and when a learned model that has been made learn predetermined data with 10% noise is compressed. It should be noted that the target data amount is 1 [MB] in this experiment.

When a learned model that has been made learn predetermined data without noise is compressed, the number of nodes that was 36399 before compression was reduced to 36382 after the first node deleting processing, and to 11764 after the second node deleting processing. In addition, the memory capacity that was 3.09383 [MB] was reduced to 3.09283 [MB] after the first node deleting processing, and to 0.999855 [MB] after the second node deleting processing. These experimental results demonstrate that the data amount can be reduced steadily to the target data amount by the second node deleting processing even in the case where no noise is applied and the effect of the first node deleting processing is small.

When a learned model that has been made learn predetermined data with 5% noise is compressed, the number of nodes that was 36399 before compression was reduced to 17542 after the first node deleting processing, and to 11764 after the second node deleting processing. In addition, the memory capacity that was 3.09383 [MB] was reduced to 1.49099 [MB] after the first node deleting processing, and to 0.999855 [MB] after the second node deleting processing. These experimental results demonstrate that the data amount is reduced to the target data amount by the second node deleting processing after the first node deleting processing contributed to a significant reduction in the data amount.

Further, when a learned model that has been made learn predetermined data with 10% noise is compressed, the number of nodes that was 36399 before compression was reduced to 16777 after the first node deleting processing, and to 11764 after the second node deleting processing. In addition, the memory capacity that was 3.09383 [MB] was reduced to 1.42596 [MB] after the first node deleting processing, and to 0.999855 [MB] after the second node deleting processing. These experimental results demonstrate that the data amount is reduced to the target data amount by the second node deleting processing after the first node deleting processing contributed to a significant reduction in the data amount.

3. Others

The present disclosure is not limited to the above embodiments and various modifications can be made.

In the above-described embodiments, the learning processing and data amount compressing processing for the learning model are both performed in the data amount compressing apparatus 10. However, the present disclosure is not limited to such a configuration. Accordingly, for example, it may be configured to be an information processing system (server client system or SaaS system) consisting of a server apparatus 40 and a client apparatus 30.

Figure 15:
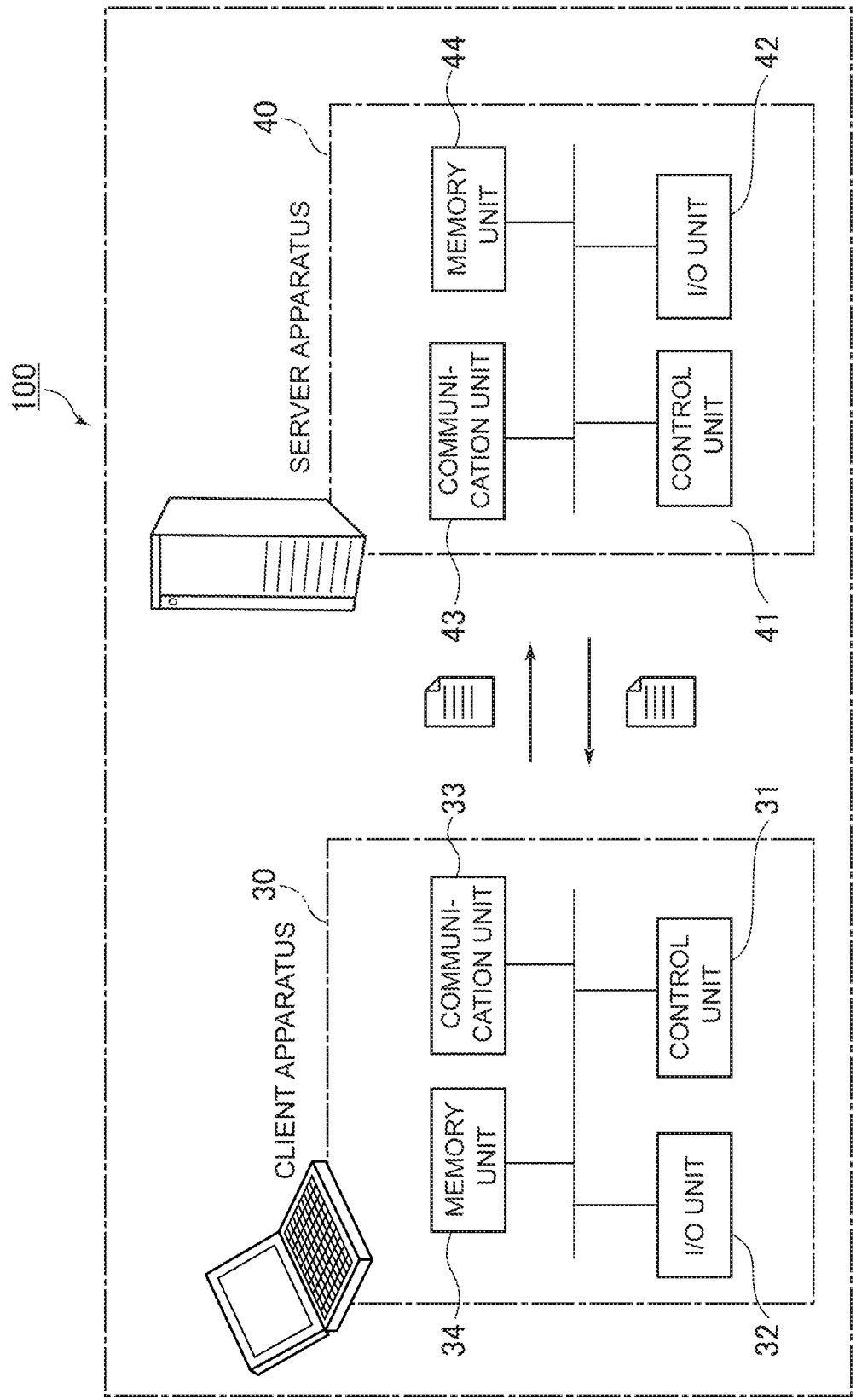
FIG. 15 is a schematic configuration diagram of an information processing system.
Figure 16:
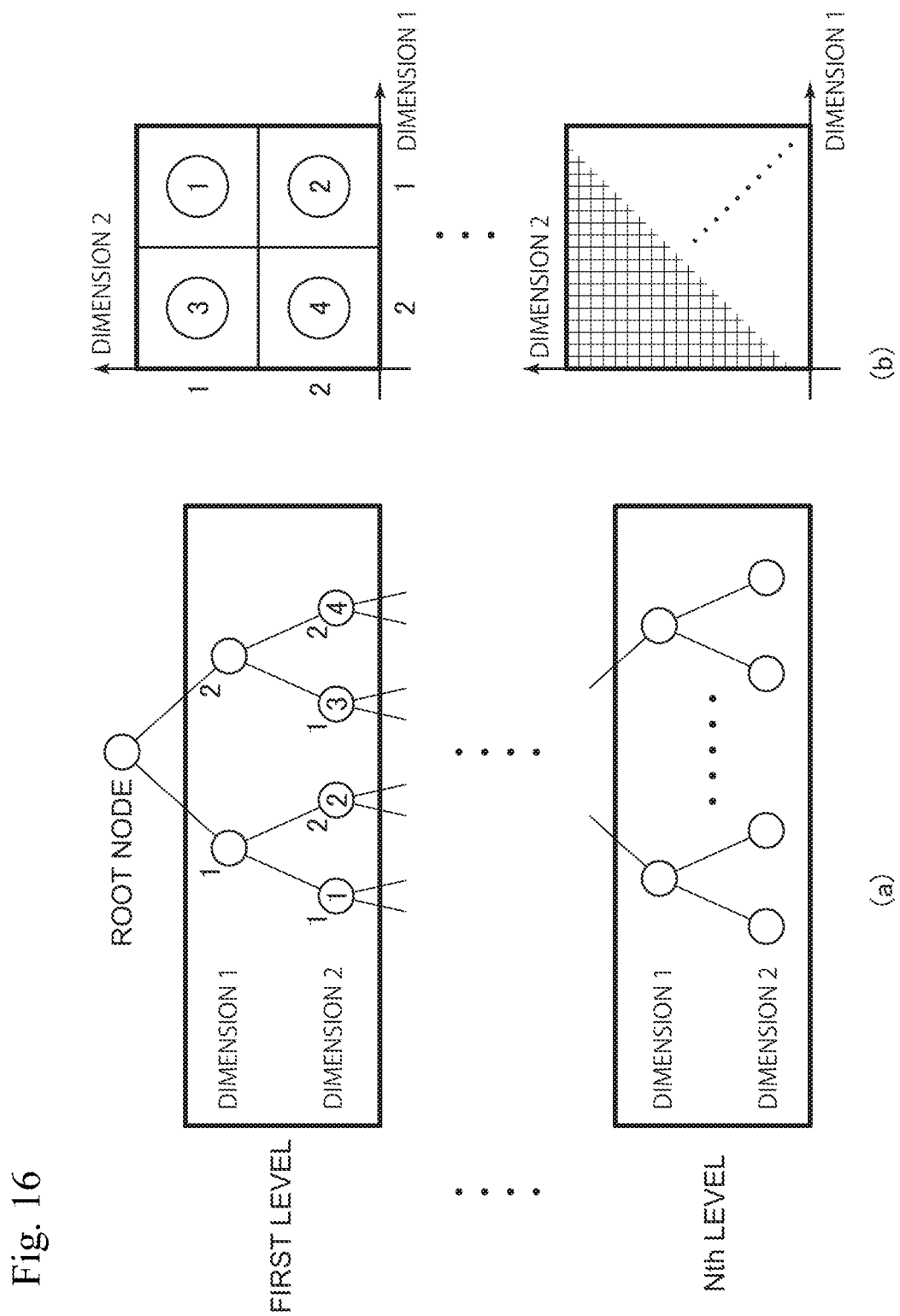
FIG. 16 is an explanatory diagram showing the structure of a learning tree.

FIG. 15 is a schematic configuration diagram of the information processing system 100. The client apparatus 30 consists of a control unit 31 for controlling the client apparatus 30, an I/O unit 32 for input and output operations, a communication unit 33 for communicating with the server apparatus 40, and a memory unit 34 for storing various kinds of information. The server apparatus 40 consists of a control unit 41 for controlling the server apparatus 40, an I/O unit 42 for input and output operations, a communication unit 43 for communicating with the client apparatus 30, and a memory unit 44 for storing various kinds of information.

In such an information processing system 100, when the user transmits a data file to be learned from the client apparatus 30 to the server apparatus 40, the server apparatus 40 executes learning processing based on the data file. Upon completion of the learning processing, the server apparatus 40 returns the parameter file including the learning conditions (e.g., input/output dimensions and various parameters) and the data file related to the learned model as a binary file to the user. Afterwards, the user transmits parameter files and binary files to the server apparatus 40 and also issues a data compression instruction to the server apparatus via communication, allowing the user to perform data compression processing on the server. With such a configuration, the client apparatus 30 is not required to have high computing power and storage capability, thereby facilitating learning processing or data compression processing.

Further, in the above-described embodiment, the data amount compression processing is performed batchwise. However, the present disclosure is not limited to such an example. Accordingly, for example, while learning processing or prediction processing is performed, data amount compression processing can be concurrently performed constantly or periodically so that the data amount does not exceed a predetermined value. With such a configuration, the operation can be performed with an appropriate data amount (storage capacity) even under an environment with a certain restriction on the storage capacity.

Moreover, in the above-described second embodiment, there is no lower limit or the like of target data amount. However, the present disclosure is not limited to such a configuration. Accordingly, in order to ensure prediction accuracy, a certain lower limit of target data amount may be provided, for example. Further, in order to ensure prediction accuracy, a configuration may be employed which permits deletion of only nodes in a predetermined level or lower.

INDUSTRIAL APPLICABILITY

The present disclosure is applicable to at least the industry for, for example, manufacturing a data amount compressing method, a data amount compressing apparatus, a data amount compressing program, and an IC chip, which has a data amount compressing function, that can compress or reduce the data amount of a learned model generated by predetermined learning processing.

REFERENCE SIGNS LIST

1 Control unit
2 I/O unit
3 Communication unit
4 Memory unit
10 Data amount compressing apparatus
30 Client apparatus
31 Control unit
32 I/O unit
33 Communication unit
34 Memory unit
40 Server apparatus
41 Control unit
42 I/O unit
43 Communication unit
44 Memory unit
100 Information processing system

What is claimed is:

1. A data amount compressing method for compressing a data amount corresponding to a learned model obtained by letting the learning model learn a predetermined data group, the learning model having a tree structure in which multiple nodes associated with respective hierarchically divided state spaces are hierarchically arranged, wherein
each node in the learned model is associated with an error amount that is generated in the process of the learning and corresponds to prediction accuracy, and
the data amount compressing method comprises:
a reading step of reading the error amount associated with each node; and
a node deleting step of deleting a part of the nodes of the learned model according to the error amount read in the reading step, thereby compressing the data amount corresponding to the learned mode, wherein
the node deleting step further comprises a second data amount compressing step, and
the second data amount compressing step comprises:
an inter-node error amount calculating step of calculating a difference between an error amount associated with each terminal node of the tree structure of the learned model and error amount of a node one level higher than the corresponding terminal node thereby calculating an inter-node error amount;
a largest-error-amount node deleting step of deleting the node having the largest error amount according to the inter-node error amounts calculated in the inter-node error amount calculating step; and
a comparison step of acquiring a data amount corresponding to the learned model for a comparison between the data amount corresponding to the learned model and a target data amount, and
the largest-error-amount node deleting step and the comparison step are repeated until the data amount corresponding to the learned model falls at or below the target data amount, and the repeating processing ends when the data amount corresponding to the learned model falls at or below the target data amount.

2. The data amount compressing method according to claim 1, wherein
the node deleting step further comprises a first data amount compressing step, and
the first data amount compressing step comprises:
a target node deleting step of setting one of the nodes as a target node and deleting the target node when an error amount of the target node is greater than an error amount of a node one level higher than the target node by a predetermined value or more and any node that has an error amount less than an error amount of a target candidate node for deletion does not exist in the levels lower than the target node; and
a repeating processing step of repeating the target node deleting step while sequentially changing the target node.

3. The data amount compressing method according to claim 1, wherein the second data amount compressing step further comprises a step of deleting nodes in descending order of their inter-node error amounts, and when nodes of an equal or substantially equal inter-node error amount exist, deleting the node closer to a terminal end of the tree structure earlier.

4. The data amount compressing method according to claim 1, wherein the data amount compressing method comprises a target data amount acquisition step of acquiring a target data amount designated by a user.

5. A data amount compressing apparatus for compressing a data amount corresponding to a learned model obtained by letting the learning model learn a predetermined data group, the learning model having a tree structure in which multiple nodes associated with respective hierarchically divided state spaces are hierarchically; arranged, wherein
each node in the learned model is associated with an error amount that is generated in the process of the learning and corresponds to prediction accuracy, and
the data amount compressing apparatus comprises:
a reading unit for reading structure information about a structure of the learned model, and the error amount associated with each node; and
a node deleting unit for deleting a part of the nodes of the learned model according to the structure information and the error amount read by the reading unit, thereby compressing the data amount corresponding to the learned model, wherein
the node deleting unit further comprises a second data amount compressing unit, and
the second data amount compressing unit comprises:
an inter-node error amount calculating unit of calculating a difference between an error amount associated with each terminal node of the tree structure of the learned model and an error amount of a node one level higher than the corresponding terminal node thereby calculating an inter-node error amount, a largest-error-amount node deleting unit of deleting the node having the largest error amount according to the inter-node error amounts calculated in the inter-node error amount calculating unit; and a comparison unit of acquiring a data amount corresponding to the learned model for a comparison between the data amount corresponding to the learned model and a target data amount, and the deleting the node having the largest error amount and the acquiring a data amount corresponding to the learned model for a comparison between the data amount corresponding to the learned model and a target data amount are repeated until the data amount corresponding to the learned model falls at or below the target data amount, and the repeating processing ends when the data amount corresponding to the learned model falls at or below the target data amount.

6. A data amount compressing program for making a computer function as a data amount compressing apparatus for compressing a data amount corresponding to a learned model obtained by letting the learning model learn a predetermined data group, the learning model having a tree structure in which multiple nodes associated with respective hierarchically divided state spaces are hierarchically arranged, wherein each node in the learned model is associated with an error amount that is generated in the process of the learning and corresponds to prediction accuracy, and the data amount compressing program comprises:

a reading step of reading structure information about a structure of the learned model, and the error amount associated with each node; and a node deleting step of deleting a part of the nodes of the learned model according to the structure information and the error amount read in the reading step, thereby compressing the data amount corresponding to the learned model wherein the program is stored on a non-transitory medium, of a computer to function as a data compression apparatus, and the node deleting step further comprises a second data amount compressing step, and the second data amount compressing step comprises:

an inter-node error amount calculating step of calculating a difference between an error amount associated with each terminal node of the tree structure of the learned model and an error amount of a node one level higher than the corresponding terminal node thereby calculating an inter-node error amount;

a largest-error-amount node deleting step of deleting the node having the largest error amount according to the inter-node error amounts calculated in the inter-node error amount calculating step; and a comparison step of acquiring a data amount corresponding to the learned model for a comparison between the data amount corresponding to the learned model and a target data amount, and the largest-error-amount node deleting step and the comparison step are repeated until the data amount corresponding to the learned model falls at or below the target data amount and the repeating processing ends when the data amount corresponding to the learned model falls at or below the target data amount.

7. An IC chip for compressing a data amount corresponding to a learned model obtained by letting the learning model learn a predetermined data group, the learning model having a tree structure in which multiple nodes associated with respective hierarchically divided state spaces are hierarchically arranged, wherein each node in the learned model is associated with an error amount that is generated in the process of the learning and corresponds to prediction accuracy, and the IC chip comprises:

a reading unit for reading structure information about a structure of the learned model, and the error amount associated with each node; and a node deleting unit for deleting a part of the nodes of the learned model according to the structure information and the error amount read by the reading unit, thereby compressing the data amount corresponding to the learned model, wherein the node deleting further comprises a second data amount compressing unit, and the second data amount compressing unit comprises:

an inter-node error amount calculating unit of the calculating a difference between an error amount associated with each terminal node of the tree structure of the learned model and an error amount of a node one level higher than the corresponding terminal node thereby calculating an inter-node error amount;

a largest-error-amount node deleting unit of deleting the node having the largest error amount according to the inter-node error amounts calculated in the inter-node error amount calculating unit; and a comparison unit of acquiring a data amount corresponding to the learned model for a comparison between the data amount corresponding to the learned model and a target data amount, and the deleting the node having the largest error amount and the acquiring a data amount corresponding to the learned model for a comparison between the data amount corresponding to the learned model and a target data amount are repeated until the data amount corresponding to the learned model falls at or below the target data amount, and the repeating processing ends when the data amount corresponding to the learned model falls at or below the target data amount.

* * * * *